United States Patent [19]

Shiralagi et al.

[11] Patent Number: 5,759,880
[45] Date of Patent: Jun. 2, 1998

[54] RESISTLESS METHODS OF FABRICATING FETS

[75] Inventors: Kumar Shiralagi, Chandler; Raymond K. Tsui, Phoenix, both of Ariz.

[73] Assignee: Motorola, Inc., Schaumburg, Ill.

[21] Appl. No.: 775,908

[22] Filed: Jan. 2, 1997

[51] Int. Cl.[6] ................................................ H01L 21/338
[52] U.S. Cl. .......................... 438/184; 438/172; 438/572; 438/690
[58] Field of Search ................................. 438/184, 185, 438/180, 181, 182, 172, 173, 46, 47, 39, 40, 41, 690, 572, 573, 582, 583, 580

[56] References Cited

U.S. PATENT DOCUMENTS

| | | | |
|---|---|---|---|
| 4,389,768 | 6/1983 | Fowler et al. | 438/184 |
| 5,153,147 | 10/1992 | Karlicek, Jr. | 438/41 |
| 5,298,445 | 3/1994 | Asano | 438/180 |
| 5,409,849 | 4/1995 | Kishita et al. | 438/172 |
| 5,480,829 | 1/1996 | Abrokwah et al. | 438/172 |
| 5,514,605 | 5/1996 | Asai et al. | 438/172 |

OTHER PUBLICATIONS

Kramer et al, "Resistless High Resolution Optical Lithography on Silicon"; Appl. Phys. Lett. 67(20), Nov. 13, 1995.

*Primary Examiner*—Michael Trinh
*Attorney, Agent, or Firm*—Eugene A. Parsons

[57] ABSTRACT

A method of fabricating semiconductor devices including forming a plurality of layers of semiconductor material on the surface of a substrate, forming a mask without using a resist on the layers which can be disassociated in-situ, removing an unmasked portion of the layers to form a semiconductor device with a gate region and opposed exposed source and drain surfaces, selectively growing source and drain contact regions on the exposed source and drain surfaces respectively, the contact regions defining opposed sidewalls adjacent the gate region, disassociating the mask, forming sidewall spacers on the sidewalls, forming a metal contact on the source, drain and gate regions with the spacers preventing intercontact therebetween, and depositing a passivating layer over the semiconductor device, with all of the previous steps being performed in-situ in a modular equipment cluster.

18 Claims, 1 Drawing Sheet

5,759,880

1

RESISTLESS METHODS OF FABRICATING FETS

FIELD OF THE INVENTION

The present invention pertains to the fabrication of semiconductor devices and more specifically to improved masking techniques during semiconductor device fabrication.

BACKGROUND OF THE INVENTION

In the semiconductor field it is common to sequentially grow several different layers of semiconductor material and use various masks and etching steps to form the desired devices and terminals on the devices. In some methods, masking material, e.g. nitride, oxide, or the like, is applied and photoresist is used to pattern the masking material. Material is grown/deposited/etched using masked and unmasked areas in subsequent processes. The material on the masked areas is then removed by etching and/or lift-off. In some instances material is selectively grown in unmasked areas and the masking material is then removed. One problem that arises is that the structure or substrate (generally a wafer) must be removed from the growth chamber to remove the masking material. The structure is then masked again and reintroduced into the growth chamber for re-growth.

Generally, in these prior art methods of fabricating semiconductor devices, etching is required to remove unwanted material and masks are removed by etching, solvent, or the like. During the etching and/or mask forming or removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

In addition to the etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer is patterned, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide resistless fabrication processes.

It is a purpose of the present invention to provide a new and improved method of fabricating FETs and the like using resistless processes.

It is still another purpose of the present invention to provide a new and improved method of fabricating semiconductor devices which does not require the introduction of contaminants, such as photoresist, solvents and etchants.

It is a further purpose of the present invention to provide a new and improved method of fabricating semiconductor devices which is much simpler and includes less chance of contamination of the devices.

SUMMARY OF THE INVENTION

The above problems and others are at least partially solved and the above purposes and others are realized in a method of fabricating semiconductor devices including the steps of providing a substrate having a surface, forming a plurality of layers of semiconductor material on the surface, resistlessly removing a portion of the layers to define a semiconductor device with a gate region and opposed exposed source and drain surfaces, selectively growing source and drain contact regions on the exposed source and drain surfaces respectively, the contact regions defining opposed sidewalls adjacent the gate region, forming sidewall spacers on the sidewalls, and forming a metal contact on each of the source contact region, drain contact region and the gate region of the semiconductor device, the sidewall spacers preventing intercontact therebetween.

In a preferred embodiment, the step of resistlessly removing a portion includes forming a mask overlying the gate region of the semiconductor device, which can be disassociated in-situ and disassociating the mask after selectively growing the source and drain contact regions. The method includes in addition a step of depositing a passivating layer over the semiconductor device and performing the steps in-situ in a modular equipment cluster.

BRIEF DESCRIPTION OF THE DRAWINGS

Referring to the drawings.

DESCRIPTION OF THE PREFERRED EMBODIMENT

Figure 1:
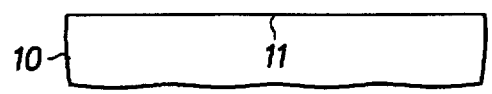
FIGS. 1 through 8 are enlarged, simplified sectional views illustrating various steps in a method of fabricating semiconductor devices in accordance with the present invention.

Turning now to the drawings in which like reference characters indicate corresponding elements throughout the several views, attention is first directed to FIG. 1 which illustrates the first step in the fabrication of a semiconductor device in accordance with the present invention. In FIG. 1, a substrate 10 having a surface 11 is provided. In this specific embodiment, substrate 10 is Gallium Arsenide (GaAs), however, it will be understood that other semiconductor materials such as Silicon, Indium Arsenide, III–V materials, etc. Surface 11 is prepared by cleaning and other processes to make it ready for epitaxial growth thereon.

Figure 2:
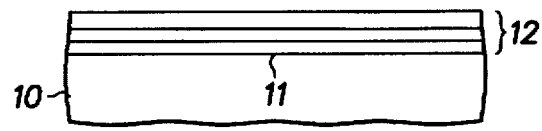
Figure 3:
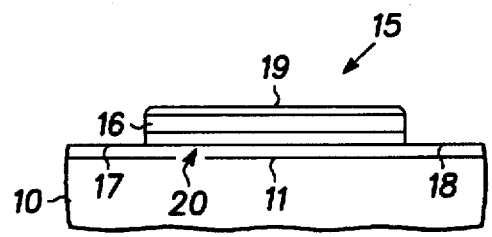

A plurality of layers 12 of semiconductor material are positioned on surface 11 by some convenient process such as epitaxial growth, as can be seen with reference to FIG. 2. Layers 12 are selected from a material which can be matched to substrate 10 and which cooperate to form a semiconductor device as will be explained presently. A portion of layers 12 is resistlessly removed to define a semiconductor device 15 with a gate region 16 and opposed exposed source and drain surfaces 17 and 18, respectively as illustrated in FIG. 3. In some applications it may not be necessary to etch a portion of layers 12 and instead any native oxide on the surface can be desorbed. The resistless removal, in this specific example, is performed by forming a mask 19 on layers 12 to define gate region 16. Mask 19 is formed of a material which can be disassociated in-situ as, for example, an oxide, nitride, carbide etc. For a more complete disclosure of a resistless removal process refer to co-pending U.S. patent application Ser. No. 08/583,329, filed Jan. 5, 1996, pending, entitled "Improved Masking Methods During Semiconductor Device Fabrication", and assigned to the same assignee.

In the preferred embodiment, the semiconductor device being fabricated is a heterojunction device such as a field effect transistor (HFET), and layers 12 include a channel region 20. It will of course be understood that the present method can be used to form other FETs, such as MESFTs, MOSFETs, etc. Layers 12 may consist of several layers of doped GaAs to match a GaAs substrate, forming gate region 16 on channel region 20, a source region underlying source surface 17 and a drain region underlying drain surface 18.

Figure 4:
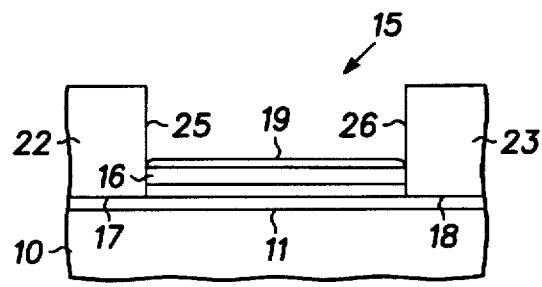

Turning now to FIG. 4, source and drain contact regions 22 and 23 are selectively grown on exposed source and drain surfaces 17 and 18 respectively. Source and drain contact regions 22 and 23 define opposed sidewalls 25 and 26 adjacent gate region 16. Sidewalls 25 and 26 extend substantially vertically upward along opposing sides of gate region 16 and beyond such that a channel is formed with gate region 16 as its floor. By employing selective growth techniques, material is grown only on the areas selected i.e. source and drain surfaces 17 and 18 and not on mask 19. In this specific example InAs is the material selectively grown as it can be controlled by growing in a specific facet orientation such as (011), which provides vertical sidewalls 25 and 26. Furthermore, InAs can be doped to provide good contact therethrough to channel region 18.

After selectively growing source and drain contact regions 22 and 23, mask 19 is disassociated in-situ by the application of heat. For example when GaAs material system is employed, mask 19 will preferably be an oxide which will disassociate at approximately 645° C. This leaves gate region 16 uncovered for subsequent contact. While mask 19 is disassociated at this time in this specific embodiment, it will be understood that it can be disassociated at any time subsequent to the selective growth step and prior to metalization of gate region 16. Mask 19 could be wet or dry etched, instead of desorbing, if convenient.

Figure 5:
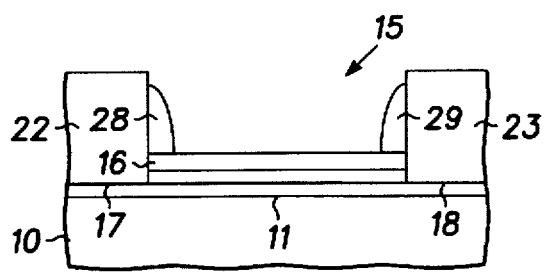

The next step is the formation of sidewall spacers 28 and 29 on sidewalls 25 and 26 respectively, as illustrated in FIG. 5. The formation of sidewall spacers is not described in detail as it is a technique known in the art. Sidewall spacers 28 and 29 are formed of a dielectric material, such as a nitride or oxide, which electrically insulates source and drain contacts from gate region 16 as will be apparent presently.

Figure 6:
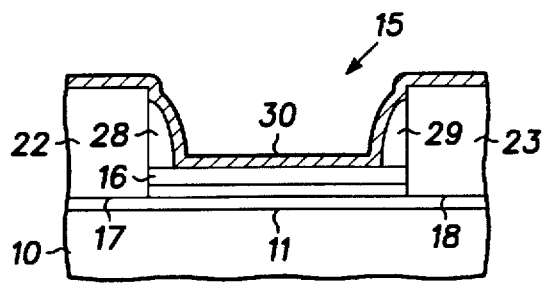
Figure 7:
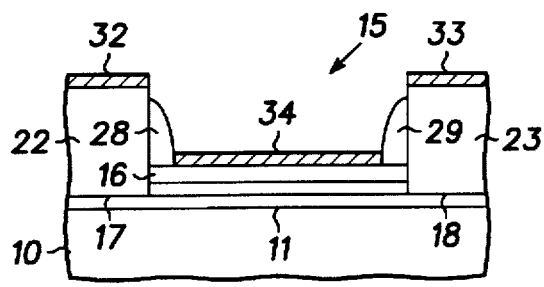

Referring now to FIG. 6, a metalization step is performed. In the embodiment illustrated, a single, contact metal layer 30 is formed overlying the entire semiconductor device 15. Layer 30 is separated into isolated metal contacts 32, 33 and 34 on each of source contact region 22, drain contact region 23 and gate region 16 of semiconductor device 15 by isotropic etch as shown in FIG. 7. Sidewall spacers 28 and 29 prevent intercontact between each of contacts 32, 33 and 34. Alternatively, formation of contacts 32, 33 and 34 may not require an etch if source and drain contact regions 22 and 23 are formed with sufficient height or undercut to prevent the formation of a single layer of contact metal. Instead, breaks in the layer will occur between the contacts 32, 33 and 34 due to the depth of the channel.

Figure 8:
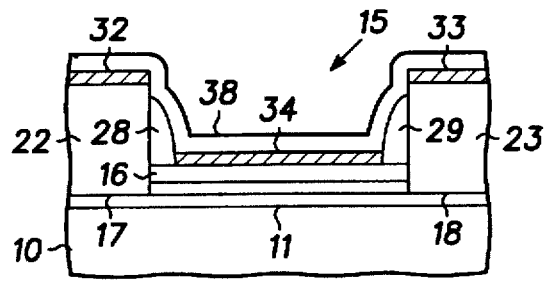

A final step is illustrated in FIG. 8. This step includes the deposition of a passivating layer 38 over the semiconductor device 15. Passivating layer 38 can be formed of oxides, nitrides, etc, and in this specific example is formed of silicon nitride. Each of the previously described steps are performed in-situ in a modular equipment cluster. Modular equipment clusters include a series of devices utilized in fabrication steps, such as epitaxial growth by MBE/CBE etc., etching and other techniques required in the process. All of these steps are performed in-situ without requiring the removal of the substrate from the chamber. Upon removal of the substrate from the chamber after completion of passivating layer 38, access to contact 32, 33 and 34 is provided and metalization for external contacts is formed.

Thus an improved method of fabricating semiconductor devices is disclosed. All current semiconductor processes use a photoresist based process to fabricate devices. The photoresists and solvents to remove them are major contaminates in the semiconductor devices. By eliminating the use of photoresists tremendous cost savings, improvements in yield, improvements in device operation and life, etc. are realized. Elimination of photoresist also enables the fabrication of devices mostly in-situ reducing all of the contamination, particulates, and clean room issues that effect the production of devices. All steps are performed in-situ, i.e. without removal from the chamber, except device isolation and contact enhancement.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating semiconductor devices comprising the steps of:

providing a substrate having a surface;

forming a plurality of layers of semiconductor material on the surface;

resistlessly removing a portion of the layers to define a semiconductor device with a gate region and opposed exposed source and drain surfaces;

selectively growing source and drain contact regions on the exposed source and drain surfaces respectively, the contact regions defining opposed sidewalls adjacent the gate region;

forming sidewall spacers on the sidewalls; and forming a metal contact on each of the source contact region, drain contact region and the gate region of the semiconductor device, the sidewall spacers preventing intercontact therebetween.

2. A method as claimed in claim 1 wherein the step of resistlessly removing a portion includes forming a mask overlying the gate region of the semiconductor device, which can be disassociated in-situ and disassociating the mask after selectively growing the source and drain contact regions.

3. A method as claimed in claim 2 wherein the step of depositing the layers includes epitaxially growing a heterojunction device having a channel region.

4. A method as claimed in claim 3 wherein the step of removing a portion further includes resistless etching to the channel region.

5. A method as claimed in claim 2 wherein the step of selectively growing includes selectively growing Indium Arsenide.

6. A method as claimed in claim 1 wherein the step of forming metal contacts includes depositing a metal layer overlying the semiconductor device, and isotropically etching the metal layer from the sidewall spacers.

7. A method as claimed in claim 1 wherein the step of forming the metal contact includes selectively growing the source and drain region to a height such that metal deposited on the source, drain, and gate region are electrically isolated.

8. A method as claimed in claim 1 including in addition a step of depositing a passivating layer over the semiconductor device.

9. A method as claimed in claim 8 wherein the steps are performed in-situ in a modular equipment cluster.

10. A method of fabricating semiconductor devices comprising the steps of:

provifing a substrate having a surface;

forming a plurality of layers of semiconductor material on the surface;

forming a mask on the layers of semiconductor material defining a gate region of a semiconductor device, the mask being formed of a material which can be disassociated in-situ;

removing an unmasked portion of the layers to form a semiconductor device with a gate region and opposed exposed source and drain surfaces;

selectively growing source and drain contact regions on the exposed source and drain surfaces respectively, the contact regions defining opposed sidewalls adjacent the gate region;

disassociating the mask;

forming sidewall spacers on the sidewalls;

forming a metal contact on each of the source contact region, drain contact region and the gate region of the semiconductor device, the sidewall spacers preventing intercontact therebetween; and performing all of the previous steps in-situ in a modular equipment cluster.

11. A method as claimed in claim 10 wherein the step of depositing the layers includes epitaxially growing a heterojunction device having a channel region.

12. A method as claimed in claim 11 wherein the step of removing a portion further includes resistless etching to the channel region.

13. A method as claimed in claim 10 wherein the step of selectively growing includes selectively growing Indium Arsenide.

14. A method as claimed in claim 10 wherein the step of forming metal contacts includes depositing a metal layer overlying the semiconductor device, and isotropically etching the metal layer from the sidewall spacers.

15. A method as claimed in claim 10 wherein the step of forming the metal contact includes selectively growing the source and drain region to a height such that metal deposited on the source, drain, and gate region are electrically isolated.

16. A method as claimed in claim 10 including in addition a step of depositing a passivating layer over the semiconductor device in-situ in the modular equipment cluster.

17. A method of fabricating semiconductor devices comprising the steps of:

providing a substrate of III–V material having a surface;

epitaxially growing a plurality of layers of III–V material on the surface;

forming a mask on the layers of III–V material defining a gate region of a heterojunction semiconductor device, the mask being formed of a material which can be disassociated in-situ;

removing an unmasked portion of the layers to form a heterojunction semiconductor device with a gate region and opposed exposed source and drain surfaces;

selectively growing source and drain contact regions of Indium Arsenide on the exposed source and drain surfaces respectively, the contact regions defining opposed sidewalls adjacent the gate region;

disassociating the mask;

forming sidewall spacers on the sidewalls;

forming a metal contact on each of the source contact region, drain contact region and the gate region of the heterojunction semiconductor device, the sidewall spacers preventing intercontact therebetween; and performing all of the previous steps in-situ in a modular equipment cluster.

18. A method as claimed in claim 17 including in addition a step of depositing a passivating layer over the semiconductor device in-situ in the modular equipment cluster.

\* \* \* \* \*